(12) United States Patent
Nomura et al.

(10) Patent No.: US 7,208,105 B2
(45) Date of Patent: Apr. 24, 2007

(54) ADHESIVE FOR CIRCUIT CONNECTION, CIRCUIT CONNECTION METHOD USING THE SAME, AND CIRCUIT CONNECTION STRUCTURE

(75) Inventors: Satoyuki Nomura, Tsukuba (JP); Tohru Fujinawa, Tsukuba (JP); Hiroshi Ono, Tsukuba (JP); Hoko Kanazawa, Tsukuba (JP); Masami Yusa, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 204 days.

(21) Appl. No.: 10/258,548

(22) PCT Filed: Apr. 25, 2001

(86) PCT No.: PCT/JP01/03547

§ 371 (c)(1),
(2), (4) Date: Oct. 25, 2002

(87) PCT Pub. No.: WO01/82363

PCT Pub. Date: Nov. 1, 2001

(65) Prior Publication Data

US 2003/0141014 A1 Jul. 31, 2003

(30) Foreign Application Priority Data

Apr. 25, 2000 (JP) .............................. 2000-128936
May 24, 2000 (JP) .............................. 2000-128937

(51) Int. Cl.
- H01B 1/12 (2006.01)
- H01B 1/22 (2006.01)
- H01L 23/14 (2006.01)

(52) U.S. Cl. .................. 252/511; 252/500; 252/519.3; 156/326; 156/349; 156/307.3; 156/330; 156/332; 524/424; 524/495; 524/496; 523/457; 523/215

(58) Field of Classification Search ................ 252/511, 252/512, 518, 500; 156/273, 326, 349, 330, 156/332, 307.3; 524/424, 495, 496; 523/215, 523/457; 442/149; 257/783; 428/346; 438/119
See application file for complete search history.

(56) References Cited

U.S. PATENT DOCUMENTS

| | | | | |
|---|---|---|---|---|
| 4,562,225 A | * | 12/1985 | Huber et al. ................. | 524/602 |
| 4,624,801 A | * | 11/1986 | Kawaguchi et al. ........ | 252/500 |
| 4,695,508 A | * | 9/1987 | Kageyama et al. ......... | 442/149 |
| 4,855,001 A | * | 8/1989 | Damico et al. .......... | 156/307.3 |
| 5,086,703 A | * | 2/1992 | Klein .......................... | 102/439 |
| 5,242,511 A | * | 9/1993 | Yokoyama et al. ......... | 148/430 |
| 5,298,194 A | * | 3/1994 | Carter et al. ................ | 252/512 |
| 5,318,651 A | * | 6/1994 | Matsui et al. ............. | 156/273.5 |
| 5,336,443 A | * | 8/1994 | Odashima ................... | 252/511 |
| 5,350,811 A | * | 9/1994 | Ichimura et al. ............ | 525/476 |
| 5,763,096 A | * | 6/1998 | Takahashi et al. .......... | 428/480 |
| 5,827,609 A | * | 10/1998 | Ercillo et al. ............... | 428/354 |
| 6,022,907 A | * | 2/2000 | Ikeda et al. .................... | 522/90 |
| 6,777,464 B1 | * | 8/2004 | Watanabe et al. ........... | 523/457 |

FOREIGN PATENT DOCUMENTS

| | | | |
|---|---|---|---|
| JP | 59-029302 | * | 2/1984 |
| JP | 01-004661 | * | 1/1989 |
| JP | 4-268381 | | 9/1992 |
| JP | 5-501425 | | 3/1993 |
| JP | 5-159622 | | 6/1993 |
| JP | 6-260533 | | 9/1994 |
| JP | 8-81669 | | 3/1996 |
| JP | 09-235355 A | * | 9/1997 |
| JP | 10-168412 | * | 6/1998 |
| JP | WO 98/44067 | * | 8/1998 |
| JP | 11-274372 | | 10/1999 |
| JP | 2000-003940 | | 1/2000 |
| WO | WO 91/06961 | | 5/1991 |

OTHER PUBLICATIONS

International Search Report mailed Aug. 7, 2001, in International (PCT) Application No. PCT/JP01/03547.
Official Action (Notice of Reasons for Rejection) dated Oct. 24, 2006, for Japanese Application No. 2001-579354.

* cited by examiner

Primary Examiner—Mark Kopec
Assistant Examiner—Kallambella Vijayakumar
(74) Attorney, Agent, or Firm—Antonelli, Terry, Stout & Kraus, LLP.

(57) ABSTRACT

There are provided an adhesive for connecting a circuit to be interposed between substrates having circuit electrodes thereon opposed to each other and to electrically connect the circuit electrodes on the substrates opposed to each other to the pressurizing direction under pressure, wherein the adhesive contains a compound having an acid equivalent of 5 to 500 KOH mg/g, and an adhesive for connecting a circuit to be interposed between substrates having circuit electrodes opposed to each other and to electrically connect the electrodes on the substrate opposed to each other to the pressurizing direction under pressure, wherein the adhesive comprises a first adhesive layer and a second adhesive layer, and a glass transition temperature of the first adhesive layer after pressure connection is higher than the glass transition temperature of the second adhesive layer after pressure connection.

13 Claims, No Drawings

ADHESIVE FOR CIRCUIT CONNECTION, CIRCUIT CONNECTION METHOD USING THE SAME, AND CIRCUIT CONNECTION STRUCTURE

TECHNICAL FIELD

This invention relates to an adhesive for connecting circuit, and a circuit connecting method and a circuit connected structure using the same.

PRIOR ART

For connecting a liquid crystal display and TCP or FPC, or TCP or FPC and a printed wiring board, an anisotropic conductive adhesive in which conductive particles had been dispersed in an adhesive have heretofore been used. Also, in recent years, when a semiconductor silicon chip is mounted on a substrate, without using the conventional wire bonding, the so-called flip chip mounted technology in which a semiconductor silicon chip is directly mounted to the substrate by face down, and application of an anisotropic conductive adhesive has been started (Japanese Provisional Patent Publications No. 120436/1984, No. 191228/1985, No. 251787/1989 and No. 90237/1995).

However, the conventional anisotropic conductive adhesive is insufficient in adhesive force to respective kinds of substrates and sufficient connection reliability cannot be obtained. In particular, to reduce damage or dimensional error to the substrate at the time of connection or to improve manufacturing efficiency, lowering in a connection temperature or shortening of a connection time is required but a sufficient reliability has not yet been obtained.

The present invention is to provide an adhesive for connecting a circuit which accomplishes low temperature connecting and shortening of a connection time, a circuit connecting method using the same and a circuit connecting structure using the same.

SUMMARY OF THE INVENTION

A first embodiment of the present invention relates to (1) an adhesive for connecting a circuit which is to be interposed between substrates having circuit electrodes thereon opposed to each other and to electrically connect the circuit electrodes on the substrates opposed to each other to the pressurizing direction under pressure, wherein said adhesive contains a compound having an acid equivalent of 5 to 500 (KOH mg/g).

(2) There is provided an adhesive for connecting a circuit described in the above (1), wherein the compound having an acid equivalent of 5 to 500 (KOH mg/g) is a compound having at least one carboxyl group.

(3) There is also provided an adhesive for connecting a circuit described in the above (1) or (2), wherein the adhesive further contains a radical polymerizable substance.

(4) There is also provided an adhesive for connecting a circuit described in any of the above (1) to (3), wherein the adhesive further contains conductive particles.

(5) There is provided a circuit connecting structure which is a circuit connecting structure to be interposed between substrates having circuit electrodes opposed to each other and to electrically connect the electrodes on the substrate opposed to each other to the pressurizing direction under pressure, wherein the adhesive for connecting a circuit is an adhesive described in any one of the above (1) to (4).

A second embodiment of the present invention is (6) an adhesive for connecting a circuit to be interposed between substrates having circuit electrodes opposed to each other and to electrically connect the electrodes on the substrate opposed to each other to the pressurizing direction under pressure, wherein said adhesive comprises a first adhesive layer and a second adhesive layer, and a glass transition temperature (Tg) of the first adhesive layer after pressure connection is higher than the Tg of the second adhesive layer after pressure connection.

(7) There is provided an adhesive for connecting a circuit described in the above (6), wherein Tg of the first adhesive layer after connection is 50 to 200° C., Tg of the second adhesive layer after connection is 40 to 100° C., and Tg of the first adhesive layer is not lower than 5° C. of Tg of the second adhesive layer after connection.

(8) There is provided an adhesive for connecting a circuit described in the above (6) or (7), wherein conductive particles are contained in at least one of the first adhesive layer and the second adhesive layer.

(9) There is provided an adhesive for connecting a circuit described in any of the above (6) to (8), wherein a radical polymerizable substance is contained in at least one of the first adhesive layer and the second adhesive layer.

(10) There is provided an adhesive for connecting a circuit described in any of the above (6) to (9), wherein a ratio of the thicknesses of the first adhesive layer and the second adhesive layer is a thickness of the first adhesive layer/a thickness of the second adhesive layer=0.3 to 3.0.

(11) There is provided an adhesive for connecting a circuit described in any of the above (6) to (10), wherein a compound having an acid equivalent of 5 to 500 (KOH mg/g) is contained in at least one of the first adhesive layer and the second adhesive layer.

(12) There is provided a circuit connecting method which comprises interposing the adhesive for connecting a circuit described in any of the above (6) to (11) between substrates having circuit electrodes opposed to each other and electrically connecting the electrodes to the pressurizing direction by pressurizing the substrates, wherein said adhesive comprises a first adhesive layer and a second adhesive layer, Tg of the first adhesive layer after pressure connection is higher than Tg of the second adhesive layer after pressure connection, and the first adhesive layer having a higher Tg is provided and connected to the substrate side having higher modulus of elasticity among the substrates having circuit electrode opposed to each other.

(13) There is provided a connecting structure which comprises the adhesive for connecting a circuit described in any of the above (6) to (11) being interposed between substrates having circuit electrodes opposed to each other and the electrodes being electrically connected to the pressurizing direction by pressurizing the substrates, wherein said adhesive comprises a first adhesive layer and a second adhesive layer, Tg of the first adhesive layer after pressure connection is higher than Tg of the second adhesive layer after pressure connection, and the first adhesive layer having a higher Tg is provided and connected to the substrate side having higher modulus of elasticity among the substrates having circuit electrode opposed to each other.

DESCRIPTION OF THE PREFERRED EMBODIMENTS

In the adhesive for connecting a circuit of the present invention, and a circuit connecting method and a circuit connecting structure of the same, no lifting (delamination)

from the substrate or peeling is generated after various reliability tests such as humidity resistance test or heat cycle test, etc., so that no lowering in an adhesive force or increase in connection resistance occurs whereby excellent connection reliability is shown.

In the first embodiment of the present invention, a compound having an acid equivalent measured by a titration method using potassium hydroxide in the range of 5 to 500 (KOH mg/g) can be used, and particularly, a compound having at least one carboxyl group is preferably used. If the acid equivalent is less than 5, improvement in adhesive force cannot be observed, while if it becomes large exceeding 500, water absorption rate of the adhesive becomes large so that reliability of humidity resistance is lowered. The carboxyl group-containing compound is not particularly limited so long as it is a compound having a carboxyl group in the molecule. Also, there is no specific limitation in a weight average molecular weight (Mw), and a compound having Mw of less than 1,000,000 is preferably used. If the molecular weight (Mw) becomes 1,000,000 or more, flowability of the adhesive lowers. Specific examples of the carboxyl group-containing compound as a copolymerizable compound may be mentioned a carboxylic acid such as oxalic acid, malonic acid, etc.; and a compound in which a carboxyl group is introduced into a polymer such as polybutadiene, polyvinyl butyral, (meth)acrylic resin, polyimide, polyamide, polystyrene, polyvinyl formal resin, polyester resin, xylene resin, phenoxy resin, polyurethane resin, urea resin, etc. When a carboxyl group is introduced into a polymer, a carboxyl group-containing compound may be used or a carboxyl group may be introduced after synthesizing the polymer. As a formulation amount of the compound in which a carboxyl group is introduced into the polymer to be used in the present invention, it is preferably 1 to 80% by weight, particularly preferably 5 to 70% by weight. If it is less than 1% by weight, adhesiveness becomes poor while if it exceeds 80% by weight, flowability tends to be lowered.

As the material other than the carboxyl group-containing compound to be used in the present invention, there may be preferably used a thermoplastic resin such as a styrene-butadiene-styrene copolymer, styrene-isoprene-styrene copolymer, etc.; a thermosetting resin such as an epoxy resin, (meth)acrylic resin, maleimide resin, citraconimide resin, nadiimide resin, phenol resin, etc., and a thermosetting resin is preferably used in the points of heat resistance and reliability, particularly a radical polymerizable material using (meth)acrylic acid, maleimide resin, citraconimide resin or nadiimide resin is preferred in the point of low temperature curing property.

The adhesive for connecting a circuit in the second embodiment of the present invention is constituted by a first adhesive layer and a second adhesive layer, and it is required that Tg of the first adhesive layer after connection is higher than Tg of the second adhesive layer after connection. Tg of the first adhesive layer is preferably 50 to 200° C., more preferably 60 to 150° C. Also, Tg of the second adhesive layer is 40 to 100° C., and Tg of the first adhesive layer is preferably 5° C. higher than Tg of the second adhesive layer after connection, particularly preferably 10° C. higher than the same.

Also, a ratio of the thickness of the first adhesive layer and the second adhesive layer is a thickness of the first adhesive layer/a thickness of the second adhesive layer=0.3 to 3.0, preferably 0.8 to 3.0. If the thickness is out of the range, no lifting from the substrate or peeling is generated after various reliability tests such as humidity resistance test or heat cycle test, etc., so that excellent connection reliability can hardly be obtained.

Moreover, in the present invention, when circuit electrodes of the substrate opposed to each other are electrically connected by using the above-mentioned two-layered adhesive layers, the first adhesive layer having higher Tg is preferably provided to the substrate side having a higher modulus of elasticity among the substrates.

As the first adhesive layer or the second adhesive layer to be used in the present invention, the above-mentioned thermo-plastic resin or the thermosetting resin is used, and a thermosetting resin is preferably used in the points of heat resistance and reliability, particularly a radical polymerizable material using (meth)acrylic acid, maleimide resin, citraconimide resin or nadiimide resin is preferred in the point of low temperature curing property.

As the (meth)acryl resin, those obtained by subjecting (meth)acrylate to radical polymerization are mentioned, and as the (meth)acrylate, there may be mentioned methyl (meth)acrylate, ethyl (meth)acrylate, isopropyl (meth)acrylate, isobutyl (meth)acrylate, ethylene glycol di(meth)acrylate, diethylene glycol di(meth)acrylate, trimethylolpropane tri(meth)acrylate, tetramethylene glycol tetra(meth)acrylate, 2-hydroxy-1,3-iacryloxypropane, 2,2-bis[4-(acryloxymethoxy)phenyl]propane, 2,2-bis[4-(acryloxyethoxy)phenyl]propane, dicyclopentenyl-meth)acrylate, tricyclodecanyl (meth)acrylate, tris(acryl-xyethyl)isocyanurate, urethane (meth)acrylate, etc., which may be used alone or in combination of two or more. If necessary, a radical polymerization inhibitor such as hydroquinone, methyl ether hydroquinone, etc. may be used within the range which does not impair curability of the product.

Moreover, when a radical polymerizable substance having a phosphate structure is used, an adhesive force to an inorganic material such as metal, etc. can be improved. An amount of the radical polymerizable substance having a phosphate structure is 0.1 to 10 parts by weight, preferably 0.5 to 5 parts by weight based on the total amount of the adhesive composition. The radical polymerizable substance having a phosphate structure can be obtained as a reaction product of anhydrous phosphoric acid and 2-hydroxyethyl (meth)acrylate. More specifically, there may be mentioned mono(2-methacryloyloxyethyl)acid phosphate, di(2-methacryloyloxyethyl)acid phosphate, etc., which may be used alone or in combination of two or more.

As the maleimide resin, those having at least one maleimide group in the molecule may be mentioned, and, for example, there may be mentioned, phenylmaleimide, 1-methyl-2,4-bismaleimide benzene, N,N'-m-phenylenebismaleimide, N,N'-p-phenylenebismaleimide, N,N'-4,4-biphenylenebismaleimide, N,N'-4,4-(3,3-dimethylbiphenylene) bismaleimide, N,N'-4,4-(3,3-dimethyldiphenylmethane) bismaleimide, N,N'-4,4-(3,3-diethyldiphenylmethane) bismaleimide, N,N'-4,4-diphenylmethanebismaleimide, N,N'-4,4-diphenylpropanebismaleimide, N,N'-4,4-diphenylether bismaleimide, N,N'-4,4-diphenylsulfone bismaleimide, 2,2-bis(4-(4-maleimidophenoxy)phenyl)propane, 2,2-bis(3-s-butyl-3,4-(4-maleimidophenoxy)phenyl)propane, 1,1-bis(4-(4-maleimidophenoxy)-phenyl)decane, 4,4'-cyclohexylidene-bis(1-(4-maleimidophenoxy)phenyl)-2-cyclohexylbenzene, 2,2-bis(4-(4-maleimidophenoxy) phenoxy)hexafluoropropane, etc., which may be used alone or in combination of two or more.

As the citraconimide resin, there may be mentioned a resin in which a citraconimide compound having at least one citraconimide group in the molecule is polymerized, and as the citraconimide compound, there may be mentioned, for example, phenylcitraconimde, 1-methyl-2,4-biscitraconimidebenzene, N,N'-m-phenylenebiscitraconimide, N,N'-p-phenylenebis citraconimide, N,N'-4,4-biphenylenebiscitraconimide, N,N'-4,4-(3,3-dimethylbiphenylene) biscitraconimide, N,N'-4,4-(3,3-dimethyldiphenylmethane) biscitraconimide, N,N'-4,4-(3,3-diethyldiphenylmethane) biscitraconimide, N,N'-4,4-diphenylmethanebiscitraconimide, N,N'-4,4-diphenylpropanebiscitraconimide, N,N'-4,4-diphenyletherbiscitraconimide, N,N'-4,4-diphenylsulfonebiscitraconimide, 2,2-bis(4-(4-citraconimidophenoxy)phenyl)propane, 2,2-bis-(3-s-butyl-3,4-(4-citraconimidophenoxy)phenyl)propane, 1,1-bis(4-(4-citraconimidophenoxy)phenyl)decane, 4,4'-cyclohexylidene-bis(1-(4-citraconimidophenoxy)phenoxy)-2-cyclohexylbenzene, 2,2-bis(4-(4-citraconimidophenoxy)phenyl)hexafluoropropane, etc., which may be used singly or in combination of two or more in admixture.

As the nadiimide resin, there may be mentioned a resin in which a nadiimide compound having at least one nadiimide group in the molecule is polymerized, and as the nadiimide compound, there may be mentioned, for example, phenylnadiimide, 1-methyl-2,4-bisnadiimidebenzene, N,N'-m-phenylenebisnadiimide, N,N'-p-phenylenebisnadiimide, N,N'-4,4-biphenylenebisnadiimide, N,N'-4,4-(3,3-dimethylbiphenylene)bisnadiimide, N,N'-4,4-(3,3-dimethyldiphenylmethane)bisnadiimide, N,N'-4,4-(3,3-diethyldiphenylmethane)bisnadiimide, N,N''-4,4-diphenylmethanebisnadiimide, N,N'-4,4-diphenylpropanebisnadiimide, N,N'-4,4-diphenyletherbisnadiimide, N,N'-4,4-diphenylsulfonebisnadiimide, 2,2-bis(4-(4-nadiimidophenoxy)phenyl)propane, 2,2-bis(3-s-butyl-3,4-(4-nadiimidophenoxy)phenyl)propane, 1,1-bis(4-(4-nadiimidophenoxy)phenyl)decane, 4,4'-cyclohexylidene-bis(1-(4-nadiimidophenoxy)phenoxy)-2-cyclohexylbenzene, 2,2-bis(4-(4-nadiimidophenoxy)phenyl)hexafluoropropane, etc., which may be used singly or in combination of two or more in admixture.

When the above-mentioned radical polymerizable compound is used, a polymerization initiator is used. As the polymerizationinitiator, it is not specifically limited so long as it is a compound which generates a radical by heat or light, and there may be mentioned a peroxide, an azo compound, etc. They are optionally selected in view of the desired connection temperature, connection time, preservation stability, etc., and in the points of high reactivity and preservation stability, an organic peroxide having a temperature of a half-life 10 hours of 40° C. or higher and a temperature of a half-life 1 minute of 180° C. or lower is preferred, and particularly preferably an organic peroxide having a temperature of a half-life 10 hours of 50° C. or higher and a temperature of a half-life 1 minute of 170° C. or lower. When the connection time is made 10 second, a formulation amount of the curing agent to obtain a sufficient reactivity is preferably 1 to 20% by weight, particularly preferably 2 to 15% by weight based on the total amount of the adhesive composition. Specific examples of the organic peroxide to be used in the present invention may be selected from diacyl peroxide, peroxydicarbonate, peroxy ester, peroxy ketal, dialkylperoxide, hydroperoxide, silylperoxide, etc. Of these, peroxy ester, dialkyl peroxide, hydroperoxide and silylperoxide are particularly preferably used since they contain a chlorine ion or an organic acid in the polymerization initiator is 5,000 ppm or lower whereby an amount of an organic acid generated after decomposition by heating is a little so that corrosion of a connecting terminal of a circuit member can be restrained.

As the diacylperoxide, there may be mentioned, for example, isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoylperoxytoluene, benzoyl peroxide, etc.

As the peroxydicarbonate, there may be mentioned, for example, di-n-propylperoxydicarbonate, diisopropylperoxydicarbonate, bis(4-t-butylcyclohexyl)peroxydicarbonate, di-2-ethoxymethoxyperoxydicarbonate, di(2-ethylexylperoxy)dicarbonate, dimethoxybutylperoxydicarbonate, di(3-methyl-3-methoxybutylperoxy)dicarbonate, etc.

As the peroxy ester, there may be mentioned, for example, cumylperoxyneodecanoate, 1,1,3,3-tetramethylbutylperoxyneodecanoate, 1-cyclohexyl-1-methylethylperoxyneodecanoate, t-hexylperoxyneodecanoate, t-butylperoxypivalate, 1,1,3,3-tetramethylbutylperoxy-2-ethylhexanonate, 2,5-dimethyl-2,5-di(2-ethylhexanoylperoxy)hexane, 1-cyclohexyl-1-methylethyl peroxy-2-ethylhexanonate, t-hexylperoxy-2-ethylhexanonate, t-butylperoxy-2-ethylhexanonate, t-butylperoxyisobutyrate, 1,1-bis(t-butylperoxy)cyclohexane, t-hexylperoxyisopropyl monocarbonate, t-butylperoxy-3,5,5-trimethylhexanonate, t-butylperoxylaurate, 2,5-dimethyl-2,5-di(m-toluoylperoxy)hexane, t-butylperoxyisopropyl monocarbonate, t-butylperoxy-2-ethylhexyl monocarbonate, t-hexylperoxybenzoate, t-butylperoxyacetate, etc.

As the peroxy ketal, there may be mentioned, for example, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, etc.

As the dialkyl peroxide, there may be mentioned, for example, α, α'-bis (t-butylperoxy)diisopropylbenzene, dicumylperoxide, 2,5-dimethyl-2,5-di(t-butylperoxy)hexane, t-butylcumylperoxide, etc.

As the hydroperoxide, there may be mentioned, for example, diisopropylbenzene hydroperoxide, cumene hydroperoxide, etc.

As the silyl peroxide, there maybe mentioned, for example, t-butyltrimethylsilyl peroxide, bis(t-butyl)dimethylsilyl peroxide, t-butyltrivinylsilyl peroxide, bis(t-butyl)-divinylsilyl peroxide, tris(t-butyl)vinylsilyl peroxide, t-butyltriallylsillyl peroxide, bis(t-butyl)diallylsillyl peroxide, tris(t-butyl)allylsillyl peroxide, etc.

These organic peroxides are preferably those containing amounts of a chlorine ion or an organic acid in the curing agent or in the organic peroxide of 5,000 ppm or less to restrain corrosion of a connection terminal of a circuit member or corrosion of a circuit electrode, and those generating less amount of an organic acid after decomposition by heating are more preferred. Also, those having a weight retaining ratio after allowing to stand under opening at a room temperature (25° C.) and a normal pressure for 24 hours of 20% by weight or more since stability of the prepared circuit connecting material is improved. These organic peroxides may be used singly or in combination of two or more.

These free radical generators may be used alone or in combination of two or more in admixture, and a decomposition accelerator or a retarder, etc., may be used in combination.

Also, when these curing agents are encapsulated in a polymer substance such as a polyurethane resin, a polyester resin, etc. to form microcapsules, they are preferably used since a usable time can be elongated.

As the thermosetting resin other than the radical polymerization, there may be mentioned an epoxy resin. As the epoxy resin, there may be mentioned, for example, a bisphenol A type epoxy resin, a bisphenol F type epoxy resin, a bisphenol S type epoxy resin, a phenol novolak type epoxy resin, a cresol novolak type epoxy resin, a bisphenol A novolak epoxy resin, a bisphenol F novolak epoxy resin, an alicyclic epoxy resin, a glycidyl ester type epoxy resin, a glycidyl amine type epoxy resin, a hydantoin type epoxy resin, an isocyanurate type epoxy resin, an aliphatic chain-state epoxy resin, etc., and these epoxy resins may be halogenated or hydrogenated. These epoxy resin may be used alone or in combination of two or more kinds in admixture.

As a curing agent of the above-mentioned epoxy resin, there may be mentioned a curing agent which has been generally used, for example, an amine, a phenol, an acid anhydride, an imidazole, a dicyanediamide, etc. Further, a tertiary amine or an organic phosphor type compound which has been generally used as a curing accelerator may be optionally used.

Also, as a method for reacting the epoxy resin, other than using the above-mentioned curing agents, a cation polymerization may be carried out by using a sulfonium salt, an iodonium salt, etc.

In the adhesive for connecting a circuit of the present invention, to provide a film-forming property, adhesive property or stress relaxing property at the time of curing, a polymer component such as a polyvinylbutyral resin, a polyvinylformal resin, a polyester resin, a polyamide resin, a polyimide resin, a xylene resin, a phenoxy resin, a polyurethane resin, a urea resin, etc., may be used. These polymer components preferably have a weight average molecular weight of 10,000 to 10,000,000. Also, these resins may be modified by at least one radical polymerizable functional group(s). When the resin is so modified, heat resistance of the resulting material is improved. Moreover, when these resins contain at least one carboxyl group(s), such a resin can be used as the carboxyl group-containing compound of the present invention. A formulation amount of the polymer component is 2 to 80% by weight, preferably 5 to 70% by weight, particularly preferably 10 to 60% by weight based on the total amount of the adhesive composition. If the amount is less than 2% by weight, stress relaxation or adhesive force is insufficient, while if it exceeds 80% by weight, flowability is lowered.

To the adhesive for connecting a circuit of the present invention may be optionally added a filler, a softening agent, a promoter, an aging preventive agent, a coloring agent, a flame retardant, a coupling agent, etc.

Even when the adhesive for connecting a circuit of the present invention does not contain conductive particles, connection can be obtained when the opposed electrodes are directly contacted to each other at the time of connection, and when it contains conductive particles, connection can be more stably established. As the conductive particles, there may be used metal particles such as Au, Ag, Ni, Cu and solder, or carbon; particles in which non-conductive particles such as glass, ceramic, plastic, etc., are covered by noble metal such as Au, Ag, Pt, etc. When metal particles are used, to prevent from oxidation at the surface of the particle, those coated by noble metal are preferably used. Of the above-mentioned conductive particles, particles using plastic as nucleic material and coated by Au, Ag, etc., or heat fusible metal particles are deformed by heating under pressure at the time of connection whereby contacting surface area is increased and reliability is improved. A thickness of the coating layer of the noble metal is generally 100 Å A or more, preferably 300 Å or more whereby good connection can be obtained. Also, particles in which the above-mentioned conductive particles are covered by an insulating resin may be used. The conductive particles are preferably used in an amount of 0.1 to 30% by volume, more preferably 0.1 to 10% by volume based on 100% by volume of the adhesive component optionally depending on the purposes.

Also, in the first embodiment of the present invention, the adhesive for connecting a circuit may be constituted by a multi-layered constitution comprising two or more layers having a glass transition temperature (Tg) of the cured product 5° C. or more different from each other.

Moreover, in the second embodiment, it is preferred to contain a compound having an acid equivalent of 5 to 500 (KOH mg/g) in at least one of the first adhesive layer and the second adhesive layer.

As a substrate to be adhered by using the adhesive for connecting a circuit of the present invention, it is not particularly limited so long as that on which electrodes for which an electrical connection is required are formed, and there may be mentioned, for example, a glass or plastic substrate on which electrodes are formed by ITO, etc., used for a liquid crystal display device, a printed wiring board, a ceramic wiring board, a flexible wiring board, a semiconductor silicon chip, etc., and these substrates are used in combination, if necessary.

When connection is carried out by using the above-mentioned substrates, as the adhesive for connecting a circuit in the second embodiment of the present invention, the first adhesive layer having a higher Tg is preferably provided to the substrate side having a higher modulus of elasticity. According to this constitution, occurrence of lifting can be reduced.

The conditions to effect connection are not particularly limited, and, for example, it is carried out at a connection temperature of 90 to 250° C. and a connection time of 1 second to 10 minutes, which can be optionally selected depending on the uses, a kind of an adhesive or a substrate to be used, etc. If necessary, a post-curing treatment maybe carried out. Also, the connection is carried out under heating and pressure, and, if necessary, an energy other than heat, such as light, an ultrasonic wave, an electromagnetic wave, etc. may be used.

EXAMPLES

In the following, the present invention is explained more specifically by referring to Examples, but the scope of the present invention is not limited by these Examples.

The respective components are formulated with the following formulation, and coated on a PET (polyethyleneterephthalate) film having a thickness of 50 μm one surface of which is subjected to surface treatment by using a simple and easy coating machine (manufactured by Tester Sangyo K. K., Japan) and dried with hot air at 70° C. for 5 minutes to prepare a film.

(Synthesis of Urethane Acrylate)

A composition comprising 400 parts by weight of polycapro-lactone diol having a weight average molecular weight (Mw) of 800, 131 parts by weight of 2-hydroxypropyl acrylate, 0.5 part by weight of dibutyl tin dilaurate as a catalyst, and 1.0 part by weight of hydroquinone monomethyl ether as a polymerization inhibitor was mixed by heating to 50° C. while stirring. Then, 222 parts by weight of isophorone diisocyanate was added dropwise to the mixture and the resulting mixture was heated to 80° C. while stirring to carry out a reaction for forming urethane. After confirming that a reaction rate of NCO became 99% or higher, the reaction temperature was lowered to obtain an urethane acrylate.

As a radical polymerizable substance, the above-mentioned urethane acrylate was used. Also, as a film-forming material, a carboxylic acid-modified butyral resin (6000EP; trade name, available from Denki Kagaku Kogyo K. K., Japan, an acid equivalent: 250 (KOH mg/g)) and a phenoxy resin (PKHC; trade name, available from Union Carbide, Co., a weight average molecular weight: 45,000) were used.

As a curing agent which generates a free radical by heating, a 50% by weight DOP (dioctylphthalate) solution of t-hexylperoxy-2-ethylhexanonate was used.

As conductive particles, conductive particles having an average particle size of 4 μm wherein on the surface of a particle comprising polystyrene as a nucleus, a nickel layer having a thickness of 0.2 μm was provided, and a gold layer having a thickness of 0.04 μm was further provided on the surface of the nickel layer were prepared and used.

Example 1

The respective components were formulated with a solid weight ratio, 20 g of the carboxylic acid-modified butyral resin (as a solid component), 30 g of the phenoxy resin (as a solid component), 49 g of the urethane acrylate, 1 g of a phosphoric acid ester type acrylate (available from Kyoeisha Yushi K. K., trade name: P2M), and 5 g of t-hexylperoxy-2-ethylhexanonate (10 gas a DOP solution), and the conductive particles are further formulated and dispersed in an amount of 3% by volume, coated and dried to obtain a circuit connecting material having an adhesive layer with a thickness of 8 μm.

(Preparation of Circuit Connecting Structure)

The above-obtained circuit connecting material was slit with a width of 1.5 mm and a piece there of was tentatively connected on a glass substrate on which an ITO was formed as an electrode under the conditions of 80° C., 5 seconds and 1 MPa. The PET substrate was peeled off and an electrode(s) of TCP was placed thereon by positioning and connected under the conditions of 150° C., 20 seconds and 4 MPa.

Example 2

The respective components were formulated with a solid weight ratio, 30 g of the carboxylic acid-modified butyral resin (as a solid component), 30 g of the phenoxy resin (as a solid component), 39 g of the urethane acrylate, 1 g of a phosphoric acid ester type acrylate (available from Kyoeisha Yushi K. K., trade name: P2M), and 5 g of t-hexylperoxy-2-ethylhexanonate (10 gas a DOP solution), and the conductive particles are further formulated and dispersed in an amount of 3% by volume, coated and dried to obtain a circuit connecting material having an adhesive layer with a thickness of 8 μm.

(Preparation of Circuit Connecting Structure)

The above-obtained circuit connecting material was slit with a width of 1.5 mm and a piece there of was tentatively connected on a glass substrate on which an ITO was formed as an electrode under the conditions of 80° C., 5 seconds and 1 MPa. The PET substrate was peeled off and an electrode(s) of TCP was placed thereon by positioning and connected under the conditions of 150° C., 20 seconds and 4 MPa.

Example 3

The respective components were formulated with a solid weight ratio, 10 g of the carboxylic acid-modified butyral resin (as a solid component), 35 g of the phenoxy resin (as a solid component), 54 g of the urethane acrylate, 1 g of a phosphoric acid ester type acrylate (available from Kyoeisha Yushi K. K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 8 μm.

(Preparation of Circuit Connecting Structure)

The above-obtained circuit connecting material was slit with a width of 1.5 mm and a piece there of was tentatively connected on a glass substrate on which an ITO was formed as an electrode under the conditions of 80° C., 5 seconds and 1 MPa. The PET substrate was peeled off and an electrode(s) of TCP was placed thereon by positioning and connected under the conditions of 150° C., 20 seconds and 4 MPa.

Comparative Example 1

The respective components were formulated with a solid weight ratio, 45 g of the phenoxy resin (as a solid component), 54 g of the urethane acrylate, 1 g of a phosphoric acid ester type acrylate (available from Kyoeisha Yushi K. K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 8 μm.

(Preparation of Circuit Connecting Structure)

The above-obtained circuit connecting material was slit with a width of 1.5 mm and a piece there of was tentatively connected on a glass substrate on which an ITO was formed as an electrode under the conditions of 80° C., 5 seconds and 1 MPa. The PET substrate was peeled off and an electrode(s) of TCP was placed thereon by positioning and connected under the conditions of 150° C., 20 seconds and 4 MPa.

(Characteristics Evaluating Method)

(1) Connection resistance: By using Multimeter TR6848 manufactured by K. K. Advantest, Japan, a resistance between circuits adjacent to each other was measured with a constant electric current of 1 mA.

(2) Adhesion strength: According to JIS Z-0237, it was measured by using Strograph E-S type manufactured by K. K. Toyo Seiki Seisakusho, Japan, with 90° peel.

(3) Observation at connected portion: Presence or absence of peeling and bubble at the connected portion was observed by a metallic microscope.

(4) Reliability evaluation: With regard to the above-mentioned connecting resistance and adhesive force, high temperature and high humidity test was carried out under the conditions of 80° C. and 95% RH (relative humidity) for 240 hours, and then, the sample was taken out and the above items (1) to (3) were tested. The measured results were shown in Table 1.

TABLE 1

| Items | Connection resistance (Ω) Initial | Connection resistance (Ω) Humidity resistance test after 240 hours | Adhesive force (N/m) Initial | Adhesive force (N/m) Humidity resistance test after 240 hours | Appearance at connected portion Initial | Appearance at connected portion Humidity resistance test after 240 hours |
|---|---|---|---|---|---|---|
| Example 1 | 2 | 2.2 | 1150 | 1000 | Good | Good |
| Example 2 | 2.2 | 2.3 | 1290 | 1180 | Good | Good |
| Example 3 | 2.1 | 2.4 | 1030 | 1030 | Good | Good |
| Comparative example 1 | 2.6 | 5.3 | 760 | 350 | Good | Lifting occurred |

In Examples 1 to 3 of the present invention, good characteristics are shown in either of the connection resistance, adhesive force and appearance at the connected portion, and even after the humidity resistance test, good reliabilities are shown. To the contrary, in Comparative example 1 wherein the compound having an acid equivalent of less than 5 (KOH mg/g) is used, an initial value of the adhesive force is low and connection resistance after the humidity resistance test is high and an adhesion force also becomes weak and lifting is occurred so that connection reliability is poor.

Example 4

(First Adhesive Layer)

As the radical polymerizable substance, dimethyloltricyclodecane diacrylate and the above-mentioned urethane acrylate were used.

As a film forming material, a phenoxy resin (PKHC; trade name, available from Union Carbide Co., a weight average molecular weight: 45,000) was used.

As a curing agent which generates a free radical by heating, a 50% by weight DOP (dioctylphthalate) solution of t-hexylperoxy-2-ethylhexanonate was used.

On the surface of a particle comprising polystyrene as a nucleus, a nickel layer with a thickness of 0.2 μm was provided, and a gold layer with a thickness of 0.04 μm was further provided on the surface of the nickel layer to prepare conductive particles having an average particle size of 4 μm.

The respective components were formulated with a solid weight ratio, 50 g of the phenoxy resin (as a solid component), 30 g of dimethyloltricyclodecane diacryalte, 19 g of the urethane acrylate, 1 g of a phosphoric acid ester type acrylate (available from Kyoeisha Yushi K. K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 8 μm (Tg of the cured product was 110° C.).

(Second Adhesive Layer)

As the radical polymerizable substance, the urethane acrylate was used.

As a film forming material, a phenoxy resin (PKHC; trade name, available from Union Carbide Co., a weight average molecular weight: 45,000) was used.

As a curing agent which generates a free radical by heating, a 50% by weight DOP (dioctylphthalate) solution of t-hexylperoxy-2-ethylhexanonate was used.

On the surface of a particle comprising polystyrene as a nucleus, a nickel layer with a thickness of 0.2 μm was provided, and a gold layer with a thickness of 0.04 μm was further provided on the surface of the nickel layer to prepare conductive particles having an average particle size of 4 μm.

The respective components were formulated with a solid weight ratio, 50 g of the phenoxy resin (as a solid component), 10 g of dimethyloltricyclodecane diacryalte, 39 g of the urethane acrylate synthesized as mentioned above, 1 g of a phosphoric acid ester type acrylate (available from Kyoeisha Yushi K. K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 18 μm (Tg of the cured product was 60° C.).

The first adhesive layer and the second adhesive layer were laminated by using a roll laminator to prepare an adhesive for connecting a circuit having a two-layered constitution.

Example 5

(First Adhesive Layer)

In the same manner as in the first adhesive layer of Example 4 except for changing the thickness of the adhesive layer to 12 μm, a circuit connecting material was obtained (Tg of the cured material was 110° C.).

(Second Adhesive Layer)

In the same manner as in the second adhesive layer of Example 4 except for changing the thickness of the adhesive layer to 15 μm, a circuit connecting material was obtained (Tg of the cured material was 60° C.).

The first adhesive layer and the second adhesive layer were laminated by using a roll laminator to prepare an adhesive for connecting a circuit having a two-layered constitution.

Example 6

(First Adhesive Layer)

In the same manner as in the first adhesive layer of Example 4 except for changing the thickness of the adhesive layer to 18 μm, a circuit connecting material was obtained (Tg of the cured material was 110° C.).

(Second Adhesive Layer)

In the same manner as in the second adhesive layer of Example 4 except for changing the thickness of the adhesive layer to 14 μm, a circuit connecting material was obtained (Tg of the cured material was 60° C.).

The first adhesive layer and the second adhesive layer were laminated by using a roll laminator to prepare an adhesive for connecting a circuit having a two-layered constitution.

Example 7

(First Adhesive Layer)

As a film forming material, a phenoxy resin (PKHC; trade name, available from Union Carbide Co., a weight average molecular weight: 45,000) was used.

As a curing agent which generates a free radical by heating, a 50% by weight DOP (dioctylphthalate) solution of t-hexylperoxy-2-ethylhexanonate was used.

On the surface of a particle comprising polystyrene as a nucleus, a nickel layer with a thickness of 0.2 µm was provided, and a gold layer with a thickness of 0.04 µm was further provided on the surface of the nickel layer to prepare conductive particles having an average particle size of 4 µm.

The respective components were formulated with a solid weight ratio, 40 g of the phenoxy resin (as a solid component), 20 g of dimethyloltricyclodecane diacryalte, 39 g of the urethane acrylate, 1 g of a phosphoric acid ester type acrylate (available from Kyoeisha Yushi K. K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 8 µm (Tg of the cured product was 68° C.).

(Second Adhesive Layer)

As the radical polymerizable substance, the urethane acrylate was used.

As a film forming material, a phenoxy resin (PKHC; trade name, available from Union Carbide Co., a weight average molecular weight: 45,000) and a carboxylic acid-modified butyral resin (6000EP; trade name, available from Denki Kagaku Kogyo K.K., Japan, an acid equivalent: 250 (KOH mg/g)) were used.

As a curing agent which generates a free radical by heating, a 50% by weight DOP (dioctylphthalate) solution of t-hexylperoxy-2-ethylhexanonate was used.

On the surface of a particle comprising polystyrene as a nucleus, a nickel layer with a thickness of 0.2 µm was provided, and a gold layer with a thickness of 0.04 µm was further provided on the surface of the nickel layer to prepare conductive particles having an average particle size of 4 µm.

The respective components were formulated with a solid weight ratio, 30 g of the phenoxy resin (as a solid component), 20 g of the carboxylic acid-modified butyral resin (as a solid component), 10 g of dimethyloltricyclodecane diacryalte, 39 g of the urethane acrylate synthesized as mentioned above, 1 g of a phosphoric acid ester type acrylate (available from Kyoeisha Yushi K.K., trade name: P2M), and 5 g of t-hexylperoxy-2-ethylhexanonate (10 g as a DOP solution), and the conductive particles are further formulated and dispersed in an amount of 3% by volume, coated and dried to obtain a circuit connecting material having an adhesive layer with a thickness of 18 µm (Tg of the cured product was 52° C.).

The first adhesive layer and the second adhesive layer were laminated by using a roll laminator to prepare an adhesive for connecting a circuit having a two-layered constitution.

Comparative Example 2

A circuit connecting material was obtained by using the first adhesive layer alone of Example 4 and making the thickness of the adhesive layer 25 µm (Tg of the cured product was 110° C.)

Comparative Example 3

A circuit connecting material was obtained by using the second adhesive layer alone of Example 4 and making the thickness of the adhesive layer 25 µm (Tg of the cured product was 60° C.)

(Preparation of Connecting Material)

The above-obtained adhesive for connecting a circuit with the two-layered constitution was slit with a width of 1.5 mm and a piece thereof was tentatively connected on a glass substrate on which an ITO was formed as an electrode (at the substrate side having a higher modulus of elasticity) under the conditions of 80° C., 5 seconds and 1 MPa. Then, the PET substrate was peeled off and positioning of an electrode of ITO and an electrode of TCP was carried out and connected under the conditions of 140° C., 20 seconds and 4 MPa.

Also, as Reference example of the present invention, the adhesive of Example 4 with the two-layered constitution was so provided that the second adhesive layer having a lower Tg is positioned at the glass side, and connection was carried out with the same conditions. Also, the adhesives for connecting a circuit prepared in Comparative examples 2 and 3 were treated in the same manner as mentioned above.

Characteristics Evaluating Method

In the same manner as in Examples 1 to 3 and Comparative example 1, the characteristics were measured.

The results of the characteristics measured were shown in Table 2.

TABLE 2

| Items | Connection resistance (Ω) | | Adhesive force (N/m) | | Appearance at connected portion | |
|---|---|---|---|---|---|---|
| | Initial | Humidity resistance test after 240 hours | Initial | Humidity resistance test after 240 hours | Initial | Humidity resistance test after 240 hours |
| Example 4 | 2.1 | 2.3 | 1200 | 1100 | Good | Good |
| Example 5 | 2.2 | 2.5 | 1050 | 1000 | Good | Good |
| Example 6 | 2.4 | 2.8 | 1250 | 1180 | Good | Good |
| Example 7 | 2.5 | 2.9 | 1000 | 970 | Good | Good |
| Comparative example 2 | 2.2 | 2.2 | 1100 | 950 | Good | Lifting occurred |
| Comparative example 3 | 2.2 | 10 | 1250 | 450 | Good | Lifting occurred |
| Reference example | 2.1 | 4.6 | 1100 | 650 | Good | Lifting occurred |

In Examples 4 to 7 of the present invention, good characteristics are shown in either of the connection resistance, adhesive force and appearance at the connected portion, and even after the humidity resistance test, good reliabilities are shown.

To the contrary, in Comparative examples 2 and 3 with a single layer constitution, in Comparative example 2 wherein Tg is 110° C., there is no change in connection resistance and is good, but the adhesive force is slightly lowered and lifting is generated. Also, in Comparative example 3 having a low Tg of 60° C., increase in connection resistance after 240 hours of the humidity resistance test is observed, the adhesive force is lowered and lifting is also generated.

On the other hand, when the second adhesive layer having a low Tg is provided at the glass substrate side, lifting may sometimes occur so that, in the present invention, it is preferred to provide the first adhesive layer having a high Td is provided at the glass substrate side.

UTILIZABOLITY IN INDUSTRY

According to the first embodiment of the present invention, adhesive forces at an initial stage and after the humidity resistance test can be made high, and an adhesive for connecting a circuit which can accomplish lowering in the connection temperature and shortening of the connection time and a circuit connecting structure using the same can be provided.

Also, in the adhesive for connecting a circuit, and a circuit connecting method and a circuit connecting structure using the same according to the second embodiment of the present invention, it is possible to carry out the connection at 140° C. for 20 seconds which corresponds to lowering in the connection temperature and shortening of the connection time. And after the humidity resistance test after the connection, no lifting which is peeling is generated so that a circuit connecting structure showing an excellent connection reliability can be provided.

The invention claimed is:

1. An adhesive adapted to connect a circuit to be interposed between substrates having circuit electrodes thereon opposed to each other and to electrically connect the circuit electrodes on the substrates opposed to each other to the pressurizing direction under pressure, wherein said adhesive contains a carboxylic acid-modified butyral resin, a phenoxy resin in addition to said carboxylic acid-modified butyral resin and a substance having a phosphate structure.

2. The adhesive according to claim 1, wherein the substance having the phosphate structure is a radical polymerizable substance having the phosphate structure.

3. The adhesive according to claim 2, wherein the adhesive further contains conductive particles.

4. The adhesive according to claim 1, wherein said phenoxy resin has a molecular weight in a range of 10,000 to 10,000,000.

5. The adhesive according to claim 1, wherein said phenoxy resin is included in an amount of 2 to 80% by weight based on total amount of adhesive.

6. The adhesive according to claim 5, wherein said phenoxy resin is included in an amount of 10 to 60% by weight based on the total amount of adhesive.

7. An adhesive which can be used to electrically connect a circuit, to be interposed between substrates having circuit electrodes thereon opposed to each other, the adhesive being used to electrically connect the circuit electrodes on the substrates opposed to each other in a pressurizing direction under pressure, wherein said adhesive contains a carboxylic acid-modified butyral resin, a phenoxy resin in addition to said carboxylic acid-modified butyral resin, and a substance having a phosphate structure.

8. The adhesive according to claim 7, wherein said adhesive contains conductive particles.

9. The adhesive according to claim 7, wherein said carboxyl group has been introduced after synthesizing the butyral resin.

10. The adhesive according to claim 9, wherein said adhesive contains conductive particles.

11. The adhesive according to claim 7, wherein said phenoxy resin has a molecular weight in a range of 10,000 to 10,000,000.

12. The adhesive according to claim 7, wherein said phenoxy resin is included in an amount of 2 to 80% by weight based on total amount of adhesive.

13. The adhesive according to claim 12, wherein said phenoxy resin is included in an amount of 10 to 60% by weight based on the total amount of adhesive.

* * * * *